(12) United States Patent
Tateoka et al.

(10) Patent No.: US 9,066,459 B2
(45) Date of Patent: Jun. 23, 2015

(54) MANUFACTURING METHOD OF MULTILAYER PRINTED WIRING BOARD

(75) Inventors: Ayumu Tateoka, Saitama (JP); Shinichi Obata, Saitama (JP); Toshiyuki Shimizu, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 14/008,038

(22) PCT Filed: Mar. 29, 2012

(86) PCT No.: PCT/JP2012/058339
§ 371 (c)(1),
(2), (4) Date: Nov. 1, 2013

(87) PCT Pub. No.: WO2012/133638
PCT Pub. Date: Oct. 4, 2012

(65) Prior Publication Data
US 2014/0054259 A1 Feb. 27, 2014

(30) Foreign Application Priority Data

Mar. 30, 2011 (JP) ................................. 2011/075529

(51) Int. Cl.
*H01B 13/00* (2006.01)
*H05K 3/46* (2006.01)
*H05K 3/02* (2006.01)

(52) U.S. Cl.
CPC .............. *H05K 3/4611* (2013.01); *H05K 3/022* (2013.01); *H05K 3/4658* (2013.01); *H05K 3/4682* (2013.01)

(58) Field of Classification Search
CPC ..... H05K 3/025; H05K 3/022; H05K 3/4611; H05K 3/4658; H05K 3/4682

USPC ........................................................... 216/13
See application file for complete search history.

(56) References Cited

U.S. PATENT DOCUMENTS 7,771,841 B2  8/2010  Suzuki et al.
7,985,488 B2  7/2011  Suzuki et al.
(Continued)

FOREIGN PATENT DOCUMENTS

JP  2002-292788  10/2002
JP  2003-181970   7/2003
(Continued)

OTHER PUBLICATIONS

Taiwan Office action, dated Jan. 8, 2014 along with an english translation thereof.
(Continued)

*Primary Examiner* — Roberts Culbert
(74) *Attorney, Agent, or Firm* — Greenblum & Bernstein, P.L.C.

(57) ABSTRACT

A manufacturing method of a multilayer printed wiring board in which a copper foil with carrier foil consists of at least four layers, a copper foil layer/a release layer/a heat-resistant metal layer/a carrier foil is used; a supporting substrate is manufactured by laminating an insulating layer constituting material to the surface of the carrier foil constituting the copper foil with carrier foil; a supporting substrate with build-up wiring layer is manufactured by forming a build-up wiring layer on the surface of the copper foil layer constituting the copper foil with carrier foil in the supporting substrate; the resulted supporting substrate with build-up wiring layer is separated at the release layer to manufacture a multilayered laminate; the resulted multilayered laminate is processed a necessary procedures to manufacture a multilayer printed wiring board.

13 Claims, 11 Drawing Sheets

(D)

(56) References Cited

U.S. PATENT DOCUMENTS

| | | |
|---|---|---|
| 8,176,627 B2 | 5/2012 | Kobayashi |
| 2004/0067377 A1 | 4/2004 | Sugimoto et al. |
| 2004/0121178 A1 | 6/2004 | Suzuki et al. |
| 2005/0249927 A1 | 11/2005 | Suzuki et al. |
| 2007/0207337 A1 | 9/2007 | Nagatani |
| 2008/0202661 A1 | 8/2008 | Kobayashi |
| 2011/0014453 A1 | 1/2011 | Ohigashi |

FOREIGN PATENT DOCUMENTS

| | | |
|---|---|---|
| JP | 3466506 B2 | 11/2003 |
| JP | 2005-101137 | 4/2005 |
| JP | 2005-262506 | 9/2005 |
| JP | 2008-218450 | 9/2008 |
| JP | 4273895 B2 | 6/2009 |
| JP | 2010-092907 | 4/2010 |
| JP | 2010-222657 | 10/2010 |
| TW | 201004500 A1 | 1/2010 |
| TW | I338543 B1 | 3/2011 |
| WO | WO 02/24444 A | 3/2002 |

OTHER PUBLICATIONS

English translation of Information Statement for JP Application No. 2013-507719, dated Oct. 3, 2014.

Korea Office action, dated Aug. 27, 2014 along with an English translation thereof.

MANUFACTURING METHOD OF MULTILAYER PRINTED WIRING BOARD

TECHNICAL FIELD

The present invention relates to a manufacturing method of a multilayer printed wiring board and a multilayer printed wiring board obtained by using the manufacturing method. In particular, the present invention relates to a manufacturing method of a multilayer printed wiring board employing a coreless build-up method in a multilayer processing of a printed wiring board.

BACKGROUND ART

Recently, multilayer structure has been widely employed in printed wiring boards for miniaturization of the printed wiring boards by increased wiring density of printed wiring boards. Multilayer printed wiring boards are used in many mobile electronic devices to achieve downsizing. Then, multilayer printed wiring boards are required both further thickness reduction in interlayer insulating layers and further weight reduction.

As a technology which satisfies such requirements, a manufacturing method employing the coreless build-up method have been used. In the coreless build-up method, a copper foil with carrier foil has been utilized for separation between the supporting substrate and the multilayer printed wiring board. As the technologies relating to the coreless build-up method, the following technologies exist.

Patent Document 1 discloses followings as can be seen in the drawings of Patent Document 1 for the purpose of improving a packaging substrate and the manufacturing method: a core substrate has construction wherein carrier copper foils 3 of copper clad laminates are stacked on both sides of a prepreg 2. The core substrate is made to be a first circuit board 10. Wiring conductor is formed on an ultra-thin copper foil 4, and a second circuit board 20 is made. An insulated resin layer is formed on the wiring conductor, and a third circuit board 30 is made. A conformal mask is formed, and a fourth circuit board 40 is made. A blind hole is formed, and a fifth circuit board 50 is made. Copper plating in the blind hole is carried out, and the hole is electrically connected. Wiring is etched on the blind hole, and a sixth circuit board is made. A supporting substrate including a carrier copper foil is removed, and a seventh circuit board is made. The ultra-thin copper foil is removed, and an eighth circuit board is obtained. In this manufacturing method, the matter is disclosed that an ultra-thin copper foil with a carrier copper foil is used, and a build-up layer is formed on the surface of the ultra-thin copper foil.

Next in Patent Document 2, the following composite copper foil is disclosed to provide a composite copper foil in which fluctuation in release strength due to the heating temperature is small, a support copper foil is easily releasable after the lamination on a resin substrate and release strength is stable: the composite copper foil consists of a thermal diffusion preventing layer which hinders the diffusion of copper between the support copper foil and an ultra-thin copper foil due to heat and a release layer which mechanically separates the support copper foil and the ultra-thin copper foil provided between the support copper foil and the ultra-thin copper foil. Further, a thermal diffusion preventing layer is described as follows in the column 0007 in Description of Patent Document 2: when a Ni—P alloy layer is used as a thermal diffusion preventing layer, preferable thickness is 0.01 to 5 μm and more preferable thickness is 0.05 to 1 μm; when the thickness is less than 0.01 μm, pinholes may exist, and release strength tends to be made unstable; and when the thickness exceeds 5 μm, the productivity tends to be made poor. According to Examples in Patent Document 2, 0.1 μm is the thinnest heat-resistant metal layer used.

DOCUMENTS CITED

Patent Documents

[Patent Document 1] Japanese Patent Laid-Open No. 2005-101137
[Patent Document 2] Japanese Patent Laid-Open No. 2002-292788

SUMMARY OF INVENTION

Problems to be Solved

However, when the heat-resistant metal layer provided between the copper foil layer and the releasing layer has thickness of 0.01 μm or more as in the composite copper foil disclosed in Patent Document 2, the thick heat-resistant metal layer remains on the surface of the build-up layer even after separation between the supporting substrate and the build-up layer as is apparent in FIG. 6(D) after the manufacturing process shown in FIG. 4 to FIG. 6. When such a thick heat-resistant metal layer remains on the surface of the build-up layer, a step for removing the heat-resistant metal layer is indispensable before processing necessary procedures on the copper foil layer.

Accordingly, the market has requested a technology in which removal of the heat-resistant metal layer is dispensable even when multilayer printed wiring boards are manufactured by employing the coreless build-up method using a copper foil with carrier foil provided with a thick heat resistant metal layer.

Means to Solve the Problem

Then, the present inventors have solved the problem by adopting the concept described below as a result of a diligent study.

Manufacturing method of a multilayer printed wiring board: A manufacturing method of a multilayer printed wiring board according to the present invention employing a coreless build-up method using a copper foil with carrier foil is characterized in including the following steps.

Step for preparation of a copper foil with carrier foil: A step for preparation of a copper foil with carrier foil consists of at least four layers of a copper foil layer/a release layer/a heat-resistant metal layer/a carrier foil and satisfies the relation [thickness of the carrier foil]>[thickness of the copper foil layer];

Step for manufacturing a supporting substrate: A step for manufacturing a supporting substrate consists of the copper foil with carrier foil and an insulating layer constituting material by laminating the insulating layer constituting material to the surface of the carrier foil constituting the copper foil with carrier foil;

Step for manufacturing a build-up wiring layer: A step for manufacturing a build-up wiring layer on the surface of the copper foil layer constituting the copper foil with carrier foil in the supporting substrate to manufacture a supporting substrate with a build-up wiring layer;

Step for separation of the supporting substrate with the build-up wiring layer: A step for separation of the supporting substrate with the build-up wiring layer at the release layer in the supporting substrate to manufacture a multilayered laminate; and Step for manufacturing a multilayer printed wiring board: A step for manufacturing a multilayer printed wiring board by processing necessary procedures on the multilayered laminate.

In the manufacturing method of a multilayer printed wiring board according to the present application, it is preferable that the copper foil with carrier foil is applied one or more treatment selected from a roughening treatment, a rust-proofing treatment and a coupling agent treatment on at least one surface of each of the carrier foil and the copper foil layer.

In the manufacturing method of a multilayer printed wiring board according to the present application, the heat-resistant metal layer constituting the copper foil with carrier foil is preferable to be formed by using nickel or a nickel alloy.

In the manufacturing method of a multilayer printed wiring board according to the present application, the release layer constituting the copper foil with carrier foil is preferable to be formed by using one or more of an organic substance selected from a group consists of a nitrogen-containing organic substance, sulfur-containing organic substance and a carboxylic acid.

Advantages of the Invention

By adopting the manufacturing method of a multilayer printed wiring board according to the present application, the heat-resistant metal layer which is hard to etch does not remain on the surface of a multilayered laminate including a build-up wiring layer manufactured by employing the coreless build-up method using a copper foil with carrier foil, and hence the step for removing the heat-resistant metal layer is dispensable. Therefore, the invention disclosed in the present application is useful in the field of manufacturing a multilayer printed wiring board.

PREFERRED EMBODIMENTS OF THE INVENTION

Hereinafter, embodiments of the manufacturing method of the multilayer printed wiring board according to the present application and the multilayer printed wiring board according to the present application will be described in turn.
[Embodiment of Manufacturing Method for Multilayer Printed Wiring Board]

The manufacturing method of a multilayer printed wiring board according to the present application is a manufacturing method of a multilayer printed wiring board employing a coreless build-up method using a copper foil with carrier foil characterized in including the following steps.

Figure 1:
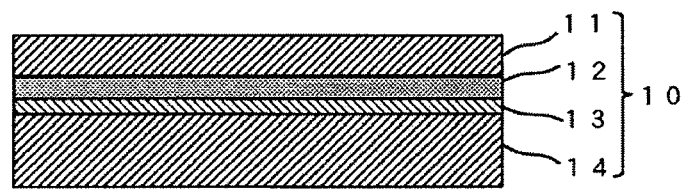
FIG. 1 is a diagram illustrating a manufacturing flow of the manufacturing method of a multilayer printed wiring board according to the present application.
Figure 1:
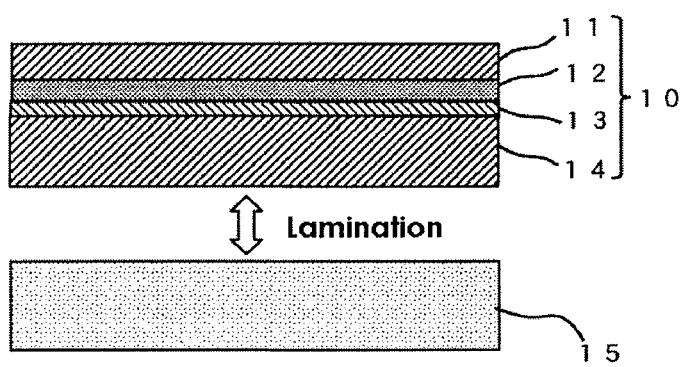
Figure 1:
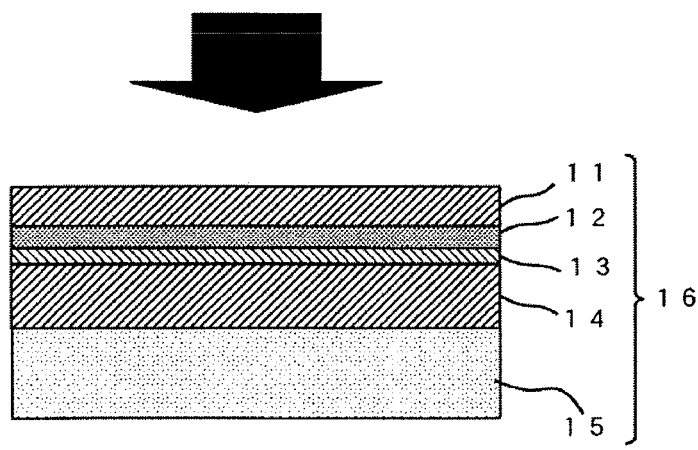

The step for preparation of a copper foil with carrier foil: The copper foil with carrier foil 10 to be prepared should consist of at least four layers of a copper foil layer 11/a release layer 12/a heat-resistant metal layer 13/a carrier foil 14. That is, basic layer structure of the copper foil with carrier foil includes a heat-resistant metal layer provided on the surface of the carrier foil, a release layer provided on the surface of the heat-resistant metal layer, and a copper foil layer provided on the surface of the release layer. Further, the relation [thickness of the carrier foil]>[thickness of the copper foil layer] is satisfied. FIG. 1(A) shows the basic layer structure of the copper foil with carrier foil 10. Hereinafter, each member constituting the copper foil with carrier foil 10 will be described.

As the carrier foil 14 constituting the copper foil with carrier foil 10, foils including a copper foil, a copper alloy foil, an aluminum foil, an aluminum alloy foil and a stainless steel foil can be used. However, in consideration of the economic efficiency and the recyclability as wastes, it is preferable to use a copper foil. The copper foil may be either an electro-deposited copper foil or a rolled copper foil. The thickness of the carrier foil is preferable to be 7 μm to 35 μm. The thickness of the carrier foil of less than 7 μm is not preferable because severe defectives including wrinkles and folds may generate in the manufacturing process of the copper foil with carrier foil sequentially provide the heat-resistant metal layer 13, the release layer 12 and the copper foil layer 11 on the surface of the carrier foil 14. In contrast, when the thickness of the carrier foil 14 exceeds 35 μm, no particular problems occur. However, even when the thickness of the carrier foil 14 is made further thicker, no significant change occurs in the effect for preventing generation of the defectives including wrinkles and folds in the manufacturing process of the copper foil with the carrier foil 10, and only the prices of the products increase without providing any particular advantages. Note that the carrier foil according to the present application is thicker than the copper foil layer and the relation [thickness of the carrier foil]>[thickness of the copper foil layer] is satisfied.

The heat-resistant metal layer 13 constituting the copper foil with carrier foil 10 is provided for preventing "the counter diffusion between the carrier foil 14 and the copper foil layer 11" which occurs in a high temperature or a prolonged hot pressing. Then, the seizing between the carrier foil 14 and the copper foil layer 11 is prevented to ensure the easy releasing between the carrier foil 14 and the copper foil layer 11. For the heat-resistant metal layer 13, it is preferable to use a metal or an alloy selected from the group consists of molybdenum, tantalum, tungsten, cobalt and nickel, and various alloys including these metal components. However, it is more preferable to form the heat-resistant metal layer 13 by using nickel or a nickel alloy. In consideration of formation of the heat-resistant metal layer 13 on the surface of the carrier foil 14 employing a wet film formation method excellent in economic efficiency such as an electroless plating method or an electro-plating method, a nickel layer or a nickel alloy layer is excellent in precision of film thickness evenness and is stable in heat resistance also. Note that, a dry film formation method including a sputtering vapor deposition method and a chemical vapor deposition method is also available for the formation of the heat-resistant metal layer 13.

The release layer 12 constituting the copper foil with carrier foil 10 may be formed by using either an organic substance or an inorganic material. When the release layer 12 consists of an inorganic material, it is preferable to use chromium, nickel, molybdenum, tantalum, vanadium, tungsten and cobalt, or the oxides of these metals. However, in consideration of the releasing stability in the release layer 12 after heat treatment including hot pressing for a long time in the manufacturing of the build-up wiring layer 20 described later, the release layer 12 is preferable to be an organic release layer formed by using an organic substance. The organic release layer is preferable to be formed by using one or mixture of two or more of an organic substance selected from the group consists of a nitrogen-containing organic compound, a sulfur-containing organic compound and a carboxylic acid.

The release strength between the carrier foil and the copper foil layer is preferable to be 5 g/cm to 80 g/cm. Release strength of less than 5 g/cm is not preferable because of possible drawback of separation between the carrier foil and the copper foil layer in the step for manufacturing the build-up wiring layer described later. In contrast, release strength exceeding 80 g/cm is not preferable also because of difficulty in separation of the supporting substrate with build-up wiring layer at the release layer in the supporting substrate in the step for separation of supporting substrate with a build-up wiring layer described later.

The copper foil layer 11 constituting the copper foil with carrier foil 10 is preferable to be formed by a wet film formation method including an electroless-copper plating method and an electro-copper plating method, a dry film formation method including a sputtering vapor deposition method and a chemical vapor deposition method, or a combination of two or more of these film formation methods. In the electroless-copper plating method and the electro-copper plating method, there is no particular limitation. For example, a thin copper layer may be formed by the electroless-copper plating method, and then the copper layer may be stacked by the electro-copper plating method to be an intended plated copper thickness. In the electro-copper plating method, a plating solution suitable for a copper ion supply source including a copper sulfate-based copper plating solution and a copper pyrophosphate-based copper plating solution can be used; however, the specific electroplating method is not particularly limited.

Further according to need, it is also preferable to apply one or more treatment selected from a roughening treatment, a rust-proofing treatment and a coupling agent treatment on the surfaces of the copper foil layer 11 and the carrier foil 14 depending on recommendation in the intended application. In particular, it is preferable to apply at least one treatment selected from the roughening treatment, the rust-proofing treatment and the silane coupling agent treatment on the surface of the carrier foil 14 to be bonded to the insulating layer constituting material 15, for the purpose to ensure a sufficient adhesion to the insulating layer constituting material 15. Note that, with respect to the surface of the copper foil layer 11, the side for formation of the build-up wiring layer, it is preferable to apply a surface treatment depending on the method for manufacturing the build-up wiring layer 20.

The step for manufacturing a supporting substrate: In this step, the insulating layer constituting material 15 is laminated on the surface of the carrier foil 14 constituting the copper foil with carrier foil 10 to manufacture the supporting substrate 16 consists of the copper foil with carrier foil 10 and the insulating layer constituting material 15 as shown in FIG. 1(B). With respect to the conditions and the methods for lamination in this step, all of the conditions and the methods used for laminating the copper foil and the insulating layer constituting material in manufacturing of a conventional printed wiring board are available. Next, there is no limitation in the insulating layer constituting material, widely and generally known insulating resin substrates can be used. Note that an insulating layer constituting material in a semi-cured state and an insulating layer constituting material after fully cured by heating are not apparently distinguished from each other in the present description and the drawings, and the same symbol number (15) is used for these insulating layer constituting materials in the drawings.

Figure 2:
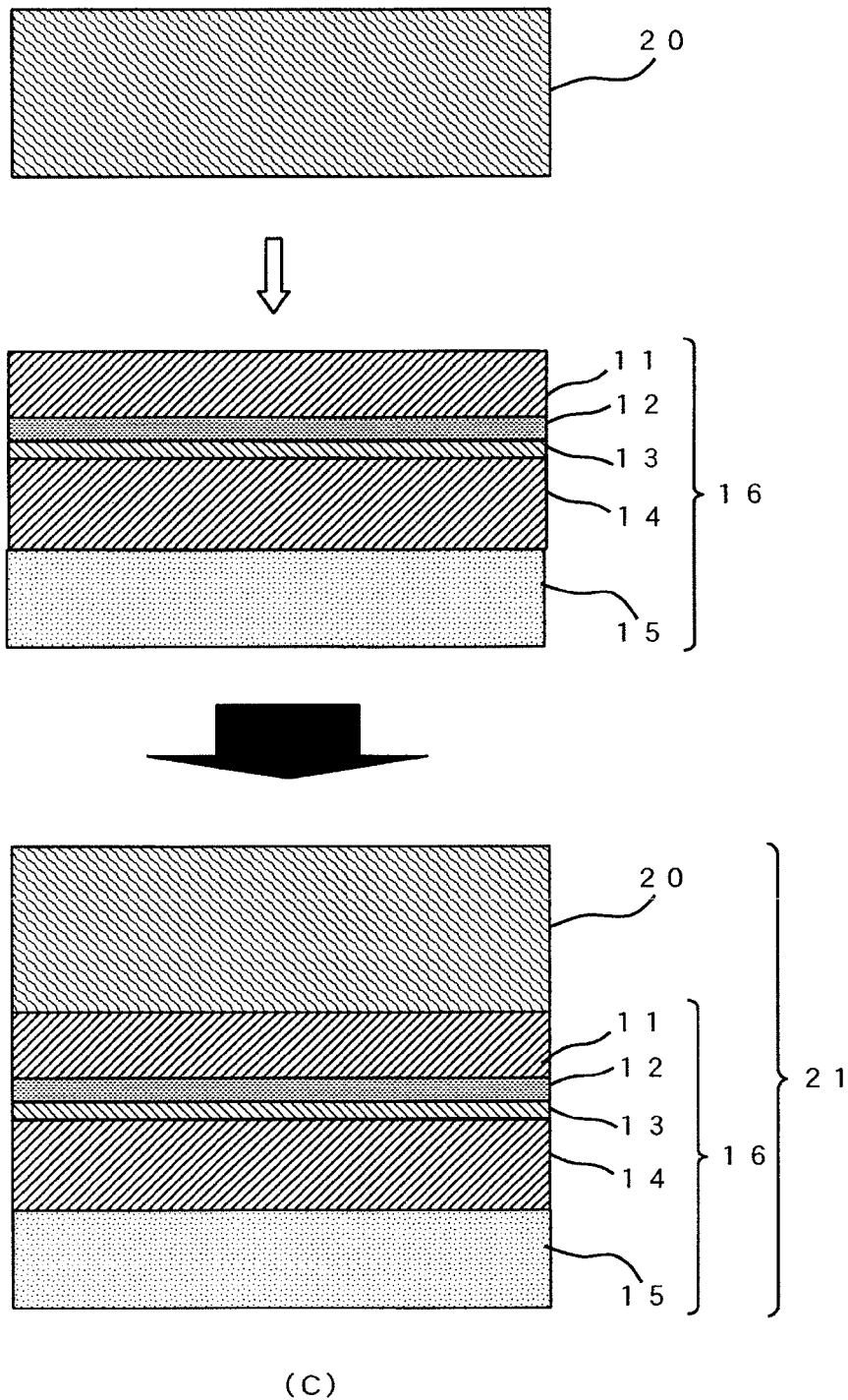
FIG. 2 is a diagram illustrating a manufacturing flow of the manufacturing method of a multilayer printed wiring board according to the present application.

The step for manufacturing a build-up wiring layer: In this step, the build-up wiring layer 20 is provided on the surface of the copper foil layer 11 constituting the copper foil with carrier foil 10 in the supporting substrate 16 to manufacture the supporting substrate with the build-up wiring layer 21 as shown in FIG. 2(C). The build-up wiring layer 20 consists of alternately laminated insulating layers and wiring layers both not-illustrated. With respect to the coreless build-up method employed in this step, it is not particularly limited.

In the step for manufacturing a build-up wiring layer, a first layer of the build-up wiring layer may be formed as follows. For example, an insulating resin layer may be formed on the surface of the copper foil layer 11 by laminating a resin film or by coating a resin composition on the surface of the copper foil layer 11 in the supporting substrate 16. When a resin film is used for formation of the insulating resin layer, the inner layer wiring interlayer-connected to the copper foil layer 11 may be formed through laminating a metal foil such as a copper foil on the surface of the resin film by hot pressing at the same time followed by formation of via holes for interlayer connection according to need followed by etching the metal foil. Alternatively, the method may be available in which only a resin film is laminated on the surface of the copper foil layer 11 in the supporting substrate 16, and then an inner layer wiring pattern may be formed on the surface of the resin film by the semi-additive method. The above-described operations for manufacturing the build-up wiring layer may be repeated plural times according to need and the repeated operation results the supporting substrate with a multilayered build-up wiring layer 21.

Figure 7:
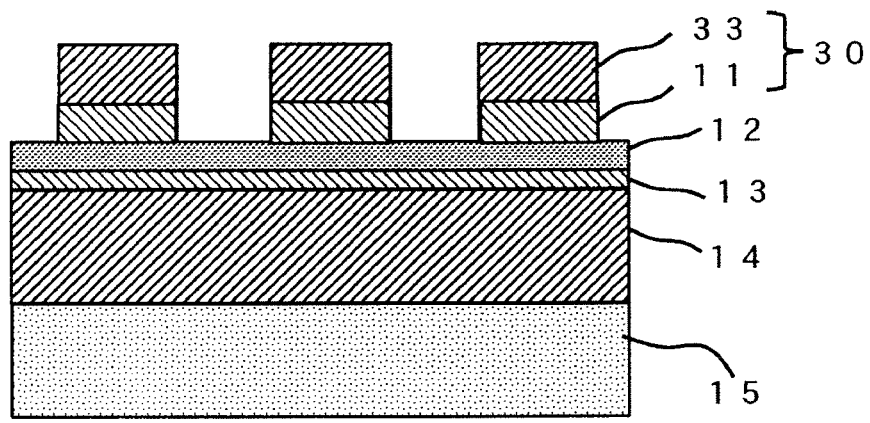
FIG. 7 is a schematic diagram exemplifying a manufacturing process of a multilayer printed wiring board.
Figure 7:
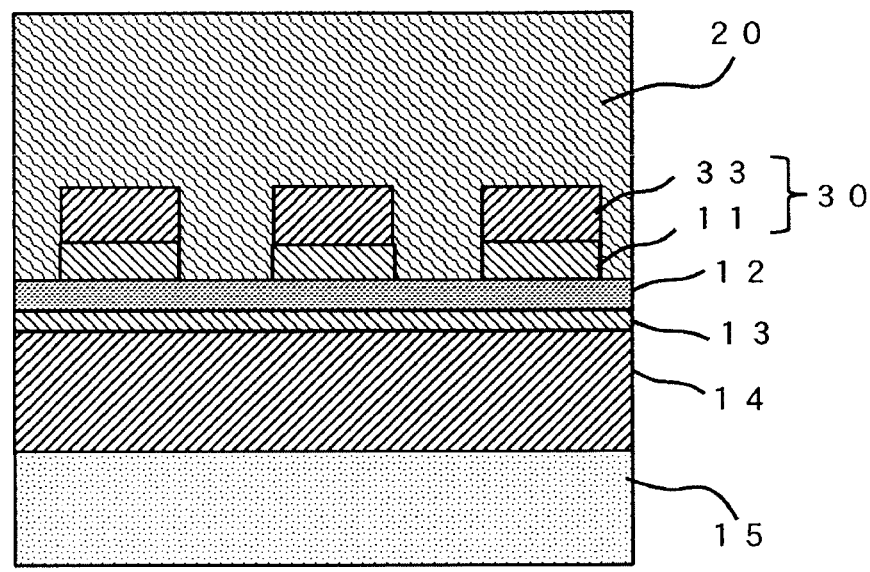

In the step for manufacturing a build-up wiring layer, a method shown in FIG. 7 may be also available. From the state shown in FIG. 1(B), the surface of the copper foil layer 11 is provided with a plating resist layer not illustrated to plate up a copper plated layer 33 on the surface portion of the copper foil layer 11 to be plated up. Then, the plating resist is removed followed by flash etching the copper foil layer 11 exposed between the copper plated layer 33 at the plated up portions to finish the wiring 30. The state shown in FIG. 7(*b*) may be obtained by forming the build-up wiring layer 20 on the resulted wiring-formed surface.

Figure 9:
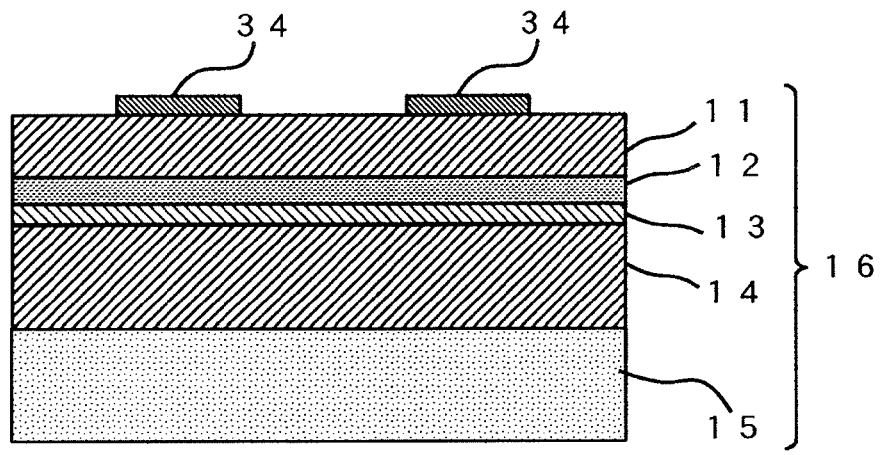
FIG. 9 is a schematic diagram exemplifying a manufacturing process of a multilayer printed wiring board.
Figure 9:
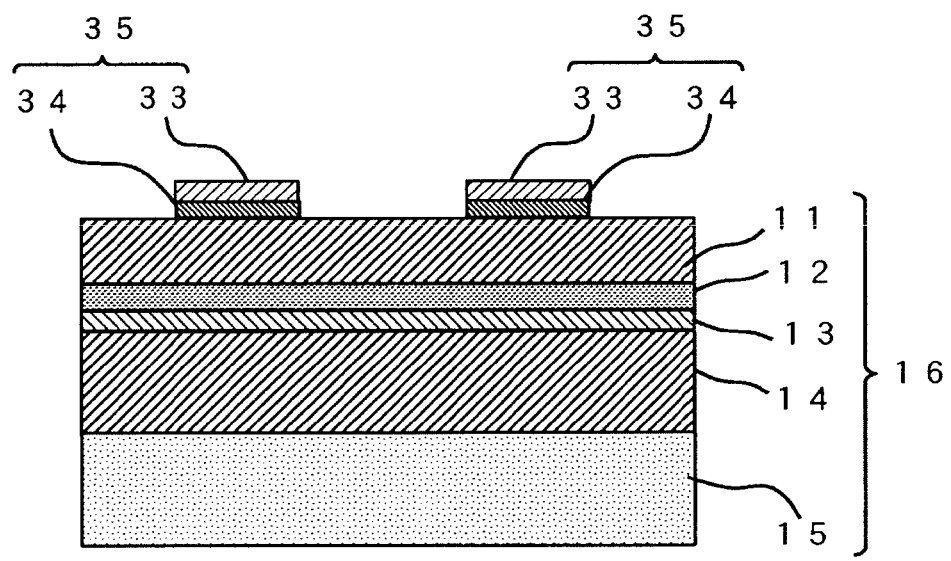
Figure 10:
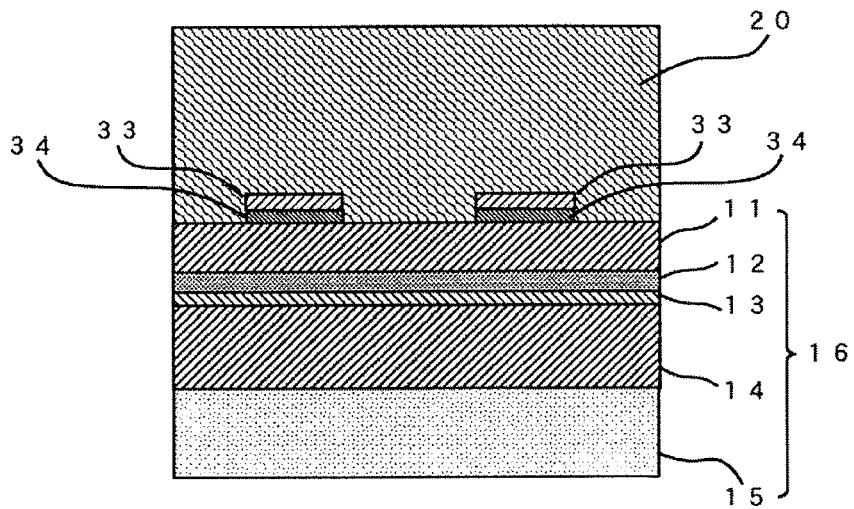
FIG. 10 is a schematic diagram exemplifying a manufacturing process of a multilayer printed wiring board.
Figure 10:
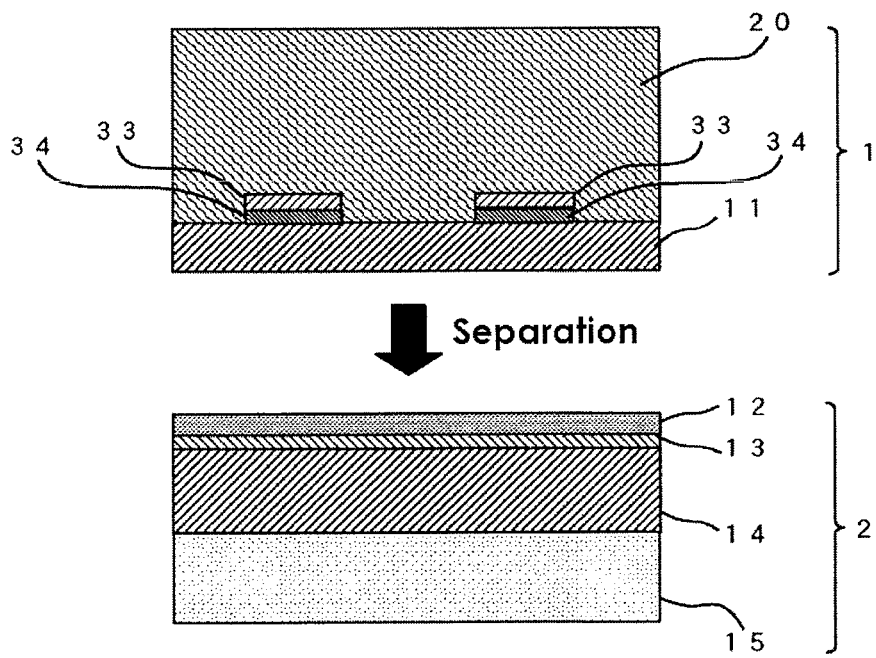

In the step for manufacturing a build-up wiring layer, a method shown in FIGS. 9 and 10 may be available. From the state shown in FIG. 1(B), an Au—Ni layer 34 is formed on the surface of the copper foil layer 11 as shown in FIG. 9(*a*).

Further, the state shown in FIG. 10(c) may be obtained by forming a copper plated layer 33 on the surface of the formed Au—Ni layer 34 to provide bumps 35 as shown in FIG. 9(b), followed by forming the build-up wiring layer 20 on the surface of the formed bumps.

Figure 3:
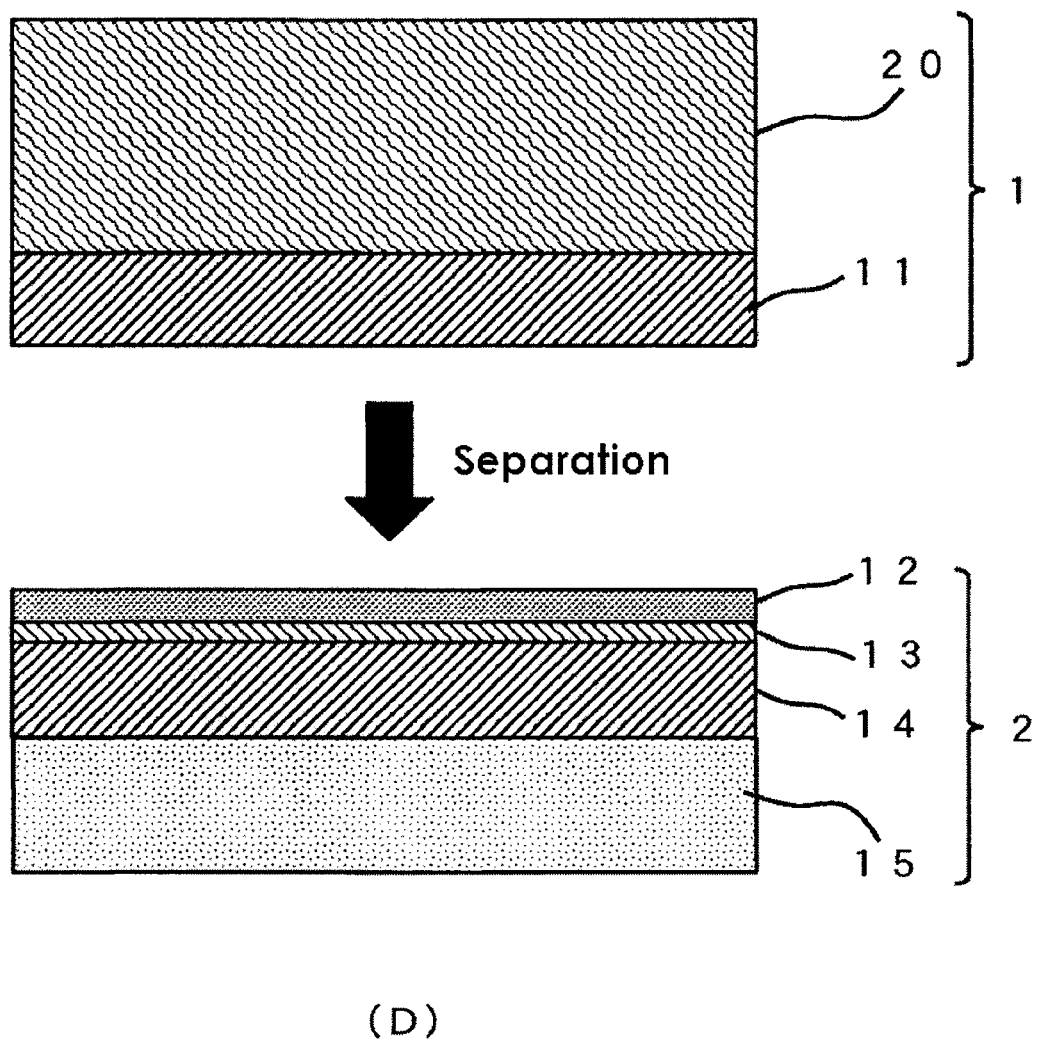
FIG. 3 is a diagram illustrating a manufacturing flow of the manufacturing method of a multilayer printed wiring board according to the present application.
Figure 4:
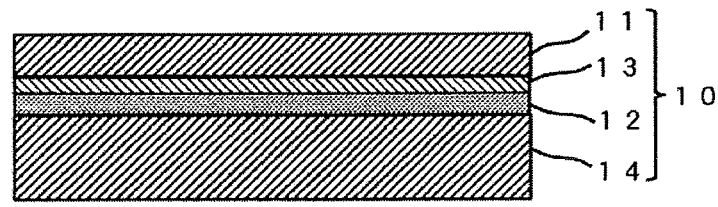
FIG. 4 is a diagram illustrating a manufacturing flow of a manufacturing method of a multilayer printed wiring board according to the combined conventional technologies.
Figure 4:
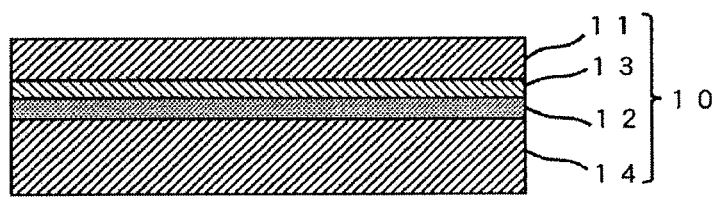
Figure 4:
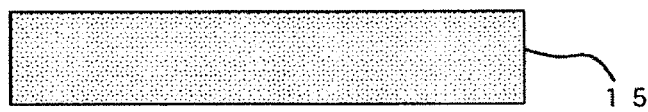
Figure 4:
Figure 4:
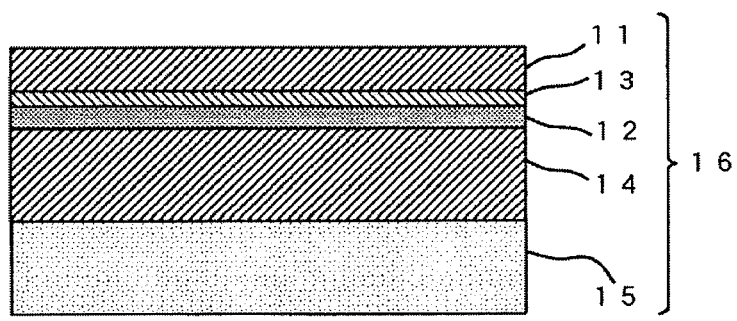
Figure 5:
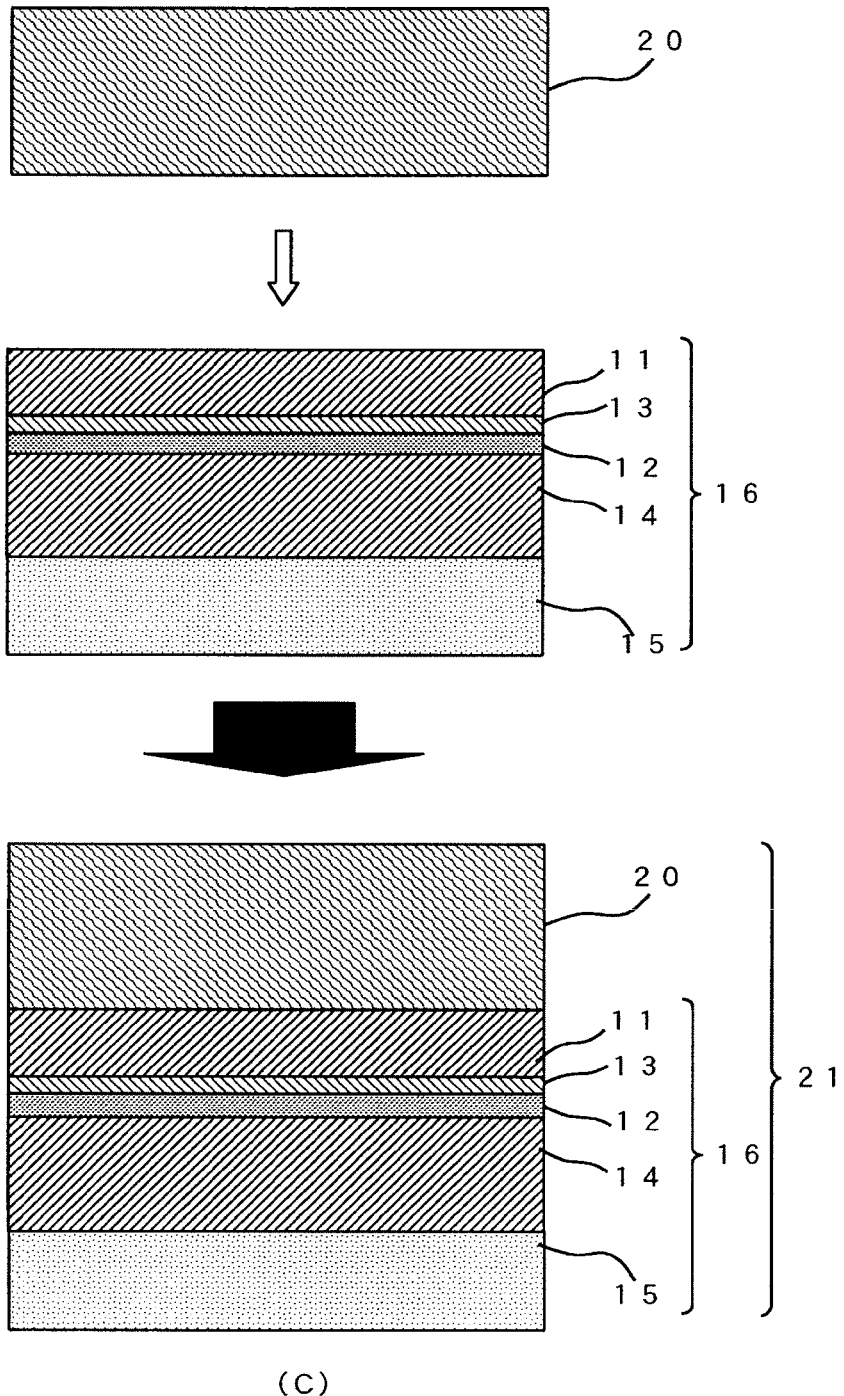
FIG. 5 is a diagram illustrating a manufacturing flow of a manufacturing method of a multilayer printed wiring board according to the combined conventional technologies.
Figure 6:
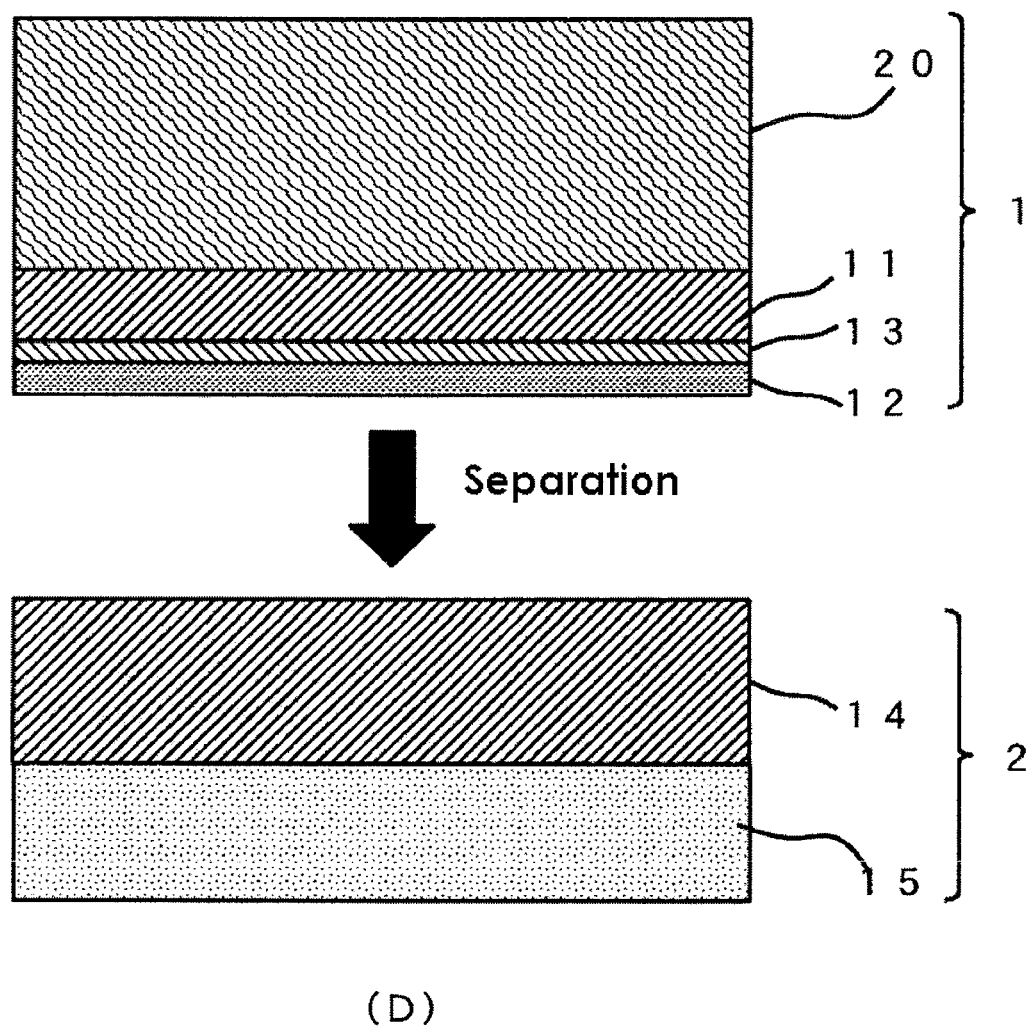
FIG. 6 is a diagram illustrating a manufacturing flow of a manufacturing method of a multilayer printed wiring board according to the combined conventional technologies.
Figure 8:
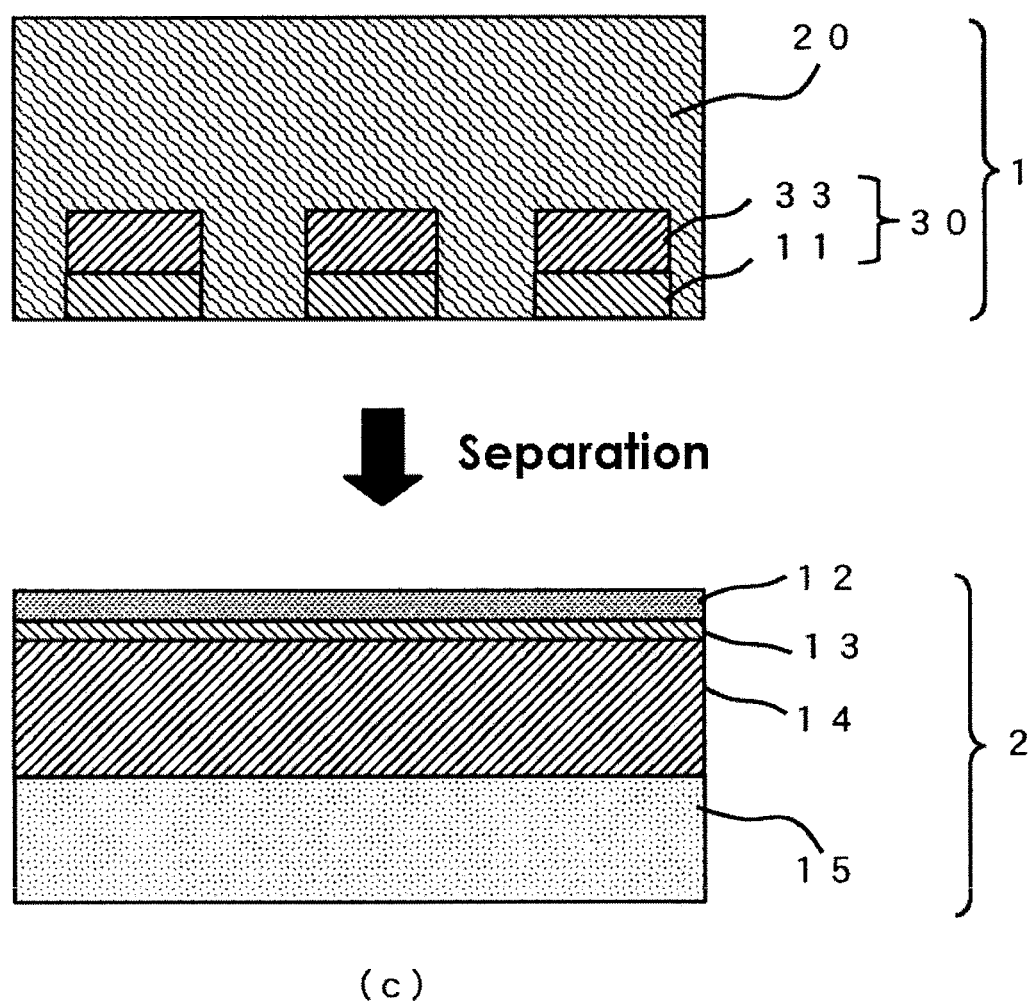
FIG. 8 is a schematic diagram exemplifying a manufacturing process of a multilayer printed wiring board.

The step for separation of a supporting substrate with a build-up wiring layer: In this step, a multilayered laminate 1 is manufactured by separating the supporting substrate with a build-up wiring layer 21 at the release layer 12 in the supporting substrate 16, and removing a separated substrate 2 as shown in FIG. 3(D), FIG. 8(c) and FIG. 10(d). The multilayered laminate 1 is a laminate in which the build-up wiring layer 20 and the copper foil layer 11 which constitutes the supporting substrate 16 adhere to each other.

The step for manufacturing a multilayer printed wiring board: In this step, a multilayer printed wiring board not illustrated is obtained through processing necessary procedures on the multilayered laminate 1. The necessary procedures are not particularly limited; the necessary procedures may be all the procedures used in the manufacturing of the printed wiring board including various types of plating, etching and resist formation. The processing methods included in the category may be different methods depending on an application of the multilayer printed wiring boards, hence a restrictive description on processing methods is difficult, and it is apparent that any of restrictive description does not make sense.

Figure 11:
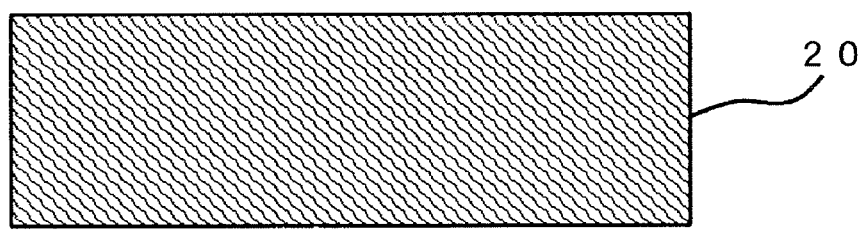
FIG. 11 is a schematic diagram exemplifying a manufacturing process of a multilayer printed wiring board.
Figure 11:
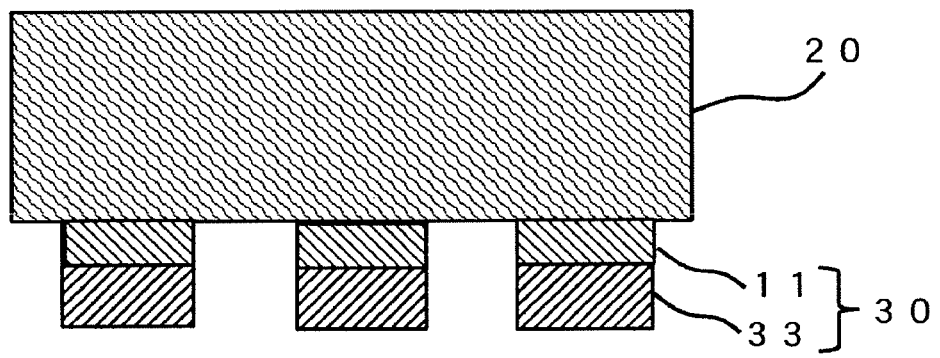

As an example of the processing methods, a method shown in FIG. 11 may be also employed. From the state shown in FIG. 3(D), the state shown in FIG. 11(a) is obtained after fully etching the copper foil layer 11. After the state shown in FIG. 11(a) is obtained, the multilayer printed wiring board may be manufactured by processing various necessary procedures. Alternatively, from the state shown in FIG. 3(D), the surface of the copper foil layer 11 is provided with a plating resist layer not illustrated to plate up a copper plated layer 33 on the surface portion of the copper foil layer 11 to be plated up. Then, the plating resist is removed followed by flash etching the copper foil layer 11 exposed between the copper plated layers 33 at the plated up portions to finish the wiring 30 to obtain the state shown in FIG. 11(b). After that, the multilayer printed wiring board may be manufactured by processing various necessary procedures.

By using the manufacturing method of a multilayer printed wiring board according to the present invention employing the coreless build-up method, a high-quality and inexpensive multilayer printed wiring board is manufactured.

[Industrial Applicability]

By adopting the manufacturing method of a multilayer printed wiring board according to the present application, no heat-resistant metal layer which is hard to etch remains on the surface of the resulted multilayered laminate even when a multilayered laminate including a build-up layer is manufactured by employing a coreless build-up method using a copper foil with carrier foil. So, the step for removing the heat-resistant metal layer is dispensable in the manufacturing method of a multilayer printed wiring board according to the present application, and manufacturing of the multilayer printed wiring board is made inexpensive.

SYMBOL LIST

1 Multilayered laminate
2 Separated substrate
10 Copper foil with carrier foil
11 Copper foil layer
12 Release layer
13 Heat-resistant metal layer
14 Carrier foil
15 Insulating layer constituting material
16 Supporting substrate
20 Build-up wiring layer
21 Supporting substrate with build-up wiring layer
30 Wiring
33 Copper plated layer
34 Au—Ni layer
35 Bump

The invention claimed is:

1. A method of manufacturing a multilayer printed wiring board, the method comprising:
   providing a carrier foil assembly, the carrier foil assembly including at least a copper foil layer, a release layer, a heat-resistant metal layer, and a carrier foil layer, wherein a thickness of the carrier foil layer is greater than a thickness of the copper foil layer;
   providing a supporting substrate by laminating an insulating layer to a surface of the carrier foil layer;
   providing a build-up wiring layer on a surface of the copper foil layer to manufacture a supporting substrate/build-up wiring layer assembly;
   separating the supporting substrate/build-up wiring assembly at the release layer in the supporting substrate to manufacture a multilayered laminate, such that the release layer, the heat-resistant metal layer, and the carrier foil layer are integrally separated together, wherein the insulating layer remains laminated to the surface of the carrier foil layer; and
   processing the multilayered laminate to manufacture a multilayer printed wiring board.

2. The manufacturing method of a multilayer printed wiring board according to claim 1, wherein said providing the carrier foil assembly comprises applying at least one or more of a roughening treatment, a rust-proofing treatment and a coupling agent treatment on at least one surface of each of the carrier foil layer and the copper foil layer.

3. The manufacturing method of a multilayer printed wiring board according to claim 1, further comprising forming the heat-resistant metal layer by using nickel or a nickel alloy.

4. The manufacturing method of a multilayer printed wiring board according to claim 1, further comprising forming the release layer by using one or more of an organic substance selected from the group consisting of a nitrogen-containing organic substance, a sulfur-containing organic substance and a carboxylic acid.

5. The manufacturing method of a multilayer printed wiring board according to claim 2, further comprising forming the heat-resistant metal layer by using nickel or a nickel alloy.

6. The manufacturing method of a multilayer printed wiring board according to claim 2, further comprising forming the release layer by using one or more of an organic substance selected from the group consisting of a nitrogen-containing organic substance, a sulfur-containing organic substance and a carboxylic acid.

7. The manufacturing method of a multilayer printed wiring board according to claim 3, further comprising forming the release layer by using one or more of an organic substance selected from the group consisting of a nitrogen-containing organic substance, a sulfur-containing organic substance and a carboxylic acid.

8. The manufacturing method of a multilayer printed wiring board according to claim 5, further comprising forming the release layer by using one or more of an organic substance selected from the group consisting of a nitrogen-containing organic substance, a sulfur-containing organic substance and a carboxylic acid.

9. The method of manufacturing a multilayer printed wiring board according to claim 1, wherein said laminating comprises laminating the insulating layer directly to the surface of the carrier foil layer.

10. The method of manufacturing a multilayer printed wiring board according to claim 1, wherein the multilayered laminate includes the build-up wiring layer and copper foil layer.

11. The method of manufacturing a multilayer printed wiring board according to claim 1, wherein said separating comprises separating the build-up wiring layer and copper foil layer from the release layer, heat-resistant metal layer, carrier foil layer and insulation layer.

12. The method of manufacturing a multilayer printed wiring board according to claim 1, wherein the carrier foil assembly includes the copper foil layer, the release layer, the heat-resistant metal layer, and the carrier foil layer in this order from an upper surface of the carrier foil assembly to a lower surface of the carrier foil assembly.

13. The method of manufacturing a multilayer printed wiring board according to claim 1, wherein the copper foil layer directly contacts the release layer, the release layer directly contacts the heat-resistant metal layer, and the heat-resistant metal layer directly contacts the carrier foil layer.

* * * * *